United States Patent [19]

Nakajima et al.

[11] Patent Number: 5,160,907
[45] Date of Patent: Nov. 3, 1992

[54] MULTIPLE LAYER SEMICONDUCTOR CIRCUIT MODULE

[75] Inventors: Yasuharu Nakajima; Akira Inoue, both of Itami, Japan

[73] Assignee: Mitsubishi Denki Kabushiki Kaisha, Japan

[21] Appl. No.: 753,049

[22] Filed: Aug. 30, 1991

[30] Foreign Application Priority Data

Sep. 3, 1990 [JP] Japan .................... 2-234097

[51] Int. Cl.$^5$ .............................. H01P 3/08
[52] U.S. Cl. .................... 333/246; 333/247; 333/33; 333/238; 361/400; 174/255
[58] Field of Search ............ 333/246, 247, 254, 99 R, 333/33, 238, 24 R, 125, 204, 164, 248; 361/397, 400, 412, 414; 174/255, 256, 260, 261

[56] References Cited

U.S. PATENT DOCUMENTS

| | | | |
|---|---|---|---|
| 4,110,712 | 10/1978 | Morris | 333/33 |
| 4,906,953 | 3/1990 | Li et al. | 333/33 |
| 4,967,171 | 10/1990 | Ban et al. | 333/246 X |
| 5,093,639 | 3/1992 | Franchi et al. | 333/24 R |

FOREIGN PATENT DOCUMENTS 114004 6/1985 Japan .
63-50102 7/1988 Japan .

OTHER PUBLICATIONS

Ladbrooke, Peter H., MMIC Design GaAs and HEMTs, Artech House, Inc., Mass., 1989, p. 29.

Primary Examiner—Eugene R. Laroche
Assistant Examiner—Ali Neyzari
Attorney, Agent, or Firm—Leydig, Voit & Mayer

[57] ABSTRACT

A multiple layer semiconductor circuit module includes a semiconductor substrate including opposed first and second surfaces and side walls; a first circuit disposed on the first surface of the substrate including a plurality of conductors, at least one of the conductors extending on the first surface of the substrate to one of the side walls; a first electrically insulating layer disposed on the first surface of the substrate, covering the first circuit, and including a second surface adjacent to the first surface of the substrate, an opposed first surface, and side walls; a second circuit disposed on the first surface of the first layer including a plurality of conductors, at least one of the conductors extending on the first surface of the first layer to one of the side walls; a second electrically insulating layer disposed on the first surface of the first layer, covering the second circuit, and including a second surface adjacent to the first surface of the first layer, an opposed first surface, and side walls; a third circuit disposed on the first surface of the second layer including a plurality of conductors, at least one of the conductors extending on the first surface of the second layer to one of the side walls; and at least one electrical conductor disposed on at least one of the side walls of the substrate and the first and second insulating layers electrically interconnecting the first, second, and third circuits.

21 Claims, 12 Drawing Sheets

MULTIPLE LAYER SEMICONDUCTOR CIRCUIT MODULE

FIELD OF THE INVENTION

The present invention relates to a multiple layer semiconductor circuit module and, particularly, to electrical interconnections between multiple circuits in different layers of a multiple layer MMIC (monolithic microwave integrated circuit) module.

BACKGROUND OF THE INVENTION

Figure 12:
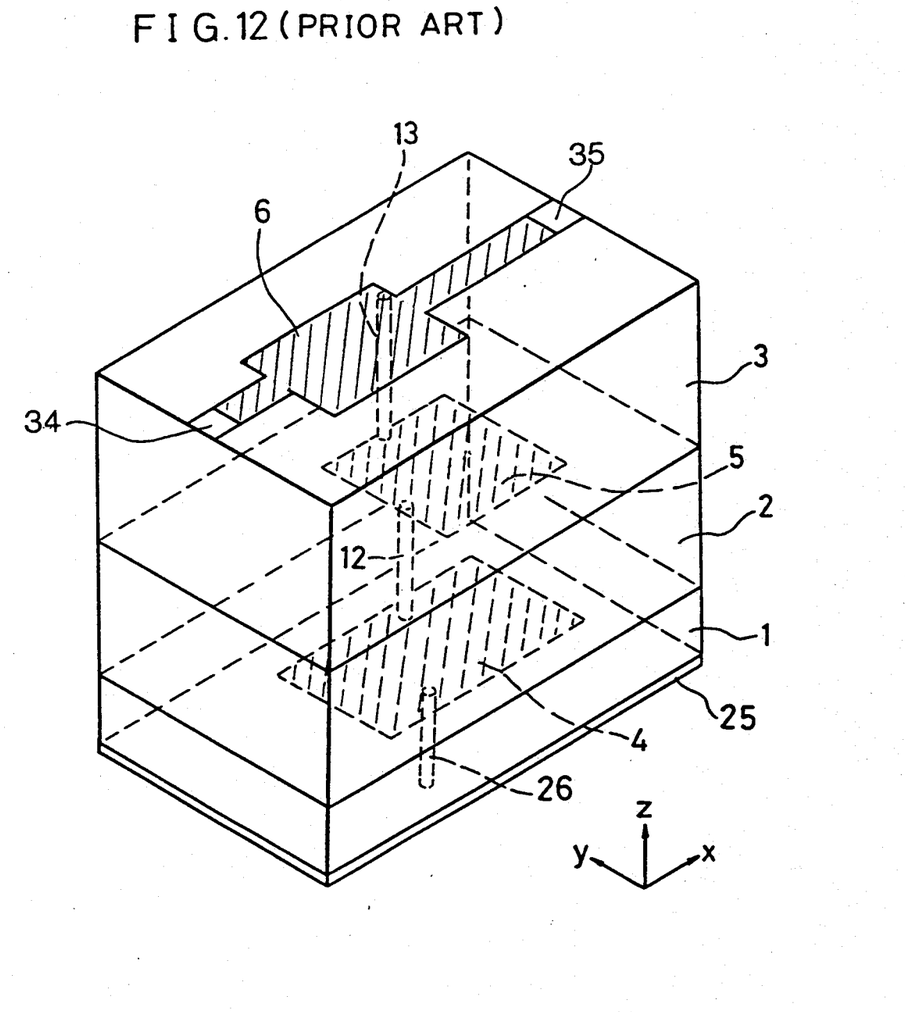
FIG. 12 is a perspective view of a multiple layer semiconductor circuit module according to the prior art.

FIG. 12 is a perspective view of a multiple layer semiconductor circuit module that may be an MMIC and that has been previously disclosed. The module includes a semiconductor substrate 1 made, for example, of gallium arsenide, silicon, indium phosphide, or another semiconductor material. The substrate 1 includes opposed first and second surfaces. A first semiconductor circuit 4 is disposed on and/or in the first surface of the substrate 1. The first circuit 4, preferably an active integrated circuit, may, for example, be an amplifier, a phase shifter, a switch, an oscillator, or the like. One or more of the circuits in the module may also be a passive circuit. A first electrically insulating layer 2, for example, a layer of SiON or SiN, is disposed on the first surface of the substrate 1, covering the first circuit 4. The first insulating layer 2 has side walls generally continuous with the side walls of the substrate 1. A second circuit 5 is disposed on the first insulating layer 2 opposite from and spaced from the first circuit 4 by the first insulating layer 2. The second circuit 4 may be formed on or placed on the first insulating film 2 and, for example, include thin films directly deposited on the first insulating film 2. Alternatively, the second circuit 5 may be a separately prepared integrated circuit that is mounted on the first insulating layer 2.

A second electrically insulating layer 3 is disposed on the first insulating layer 2 covering the second circuit 5. A third circuit 6 is disposed on a surface of the second insulating layer 3 opposite the second circuit 5 and spaced from the second circuit 5 by the second insulating layer 3. The second insulating layer 3 also includes side walls that are generally continuous with the side walls of the first insulating layer 2 and the substrate 1. The third circuit 6 may be formed in the same way as circuit 5, i.e., by depositing thin films directly on the second insulating layer 3 or by mounting a separately prepared integrated circuit. One or both of the second and third circuits 5 and 6, like the first circuit 4, may be selected from active circuits, such as amplifiers, phase shifters, switches, oscillators, and other circuits, or from passive circuits.

The circuits 4, 5, and 6 are electrically interconnected through via hole structures that penetrate the respective first and second insulating layers 2 and 3. For example, as shown in FIG. 12, a first via hole structure 12 electrically interconnects the first circuit 4 with the second circuit 5. As well known in the art, via hole structures include a passage extending through an insulating material. The walls of the passage are plated with, or the entire passage is filled with, an electrical conductor providing a conducting path between elements located on opposite sides of the via hole structure. In FIG. 12, a second via hole 13 provides an electrical interconnection between second circuit 5 and the third circuit 6. Via hole structures 12 and 13 are merely illustrative and the multiple interconnections between the circuits 4, 5, and 6 may be provided through the use of multiple via hole structures.

The outermost surface of the module includes a conducting strip with input and output terminals 34 and 35. When the module is an MMIC, the dimensions and the arrangement of the conductors of the input and output lines and terminals 34 and 35 are chosen to produce the best performance for the frequency range employed. In many modules, particularly those employed in a microwave frequency range, it is preferable to include a grounding electrode 25 on the second surface of the substrate 1 as shown in FIG. 12. In that case, a third via hole structure 26 extending through the substrate 1 provides a ground connection to the first circuit 4 from the grounding electrode 25.

Figure 13:
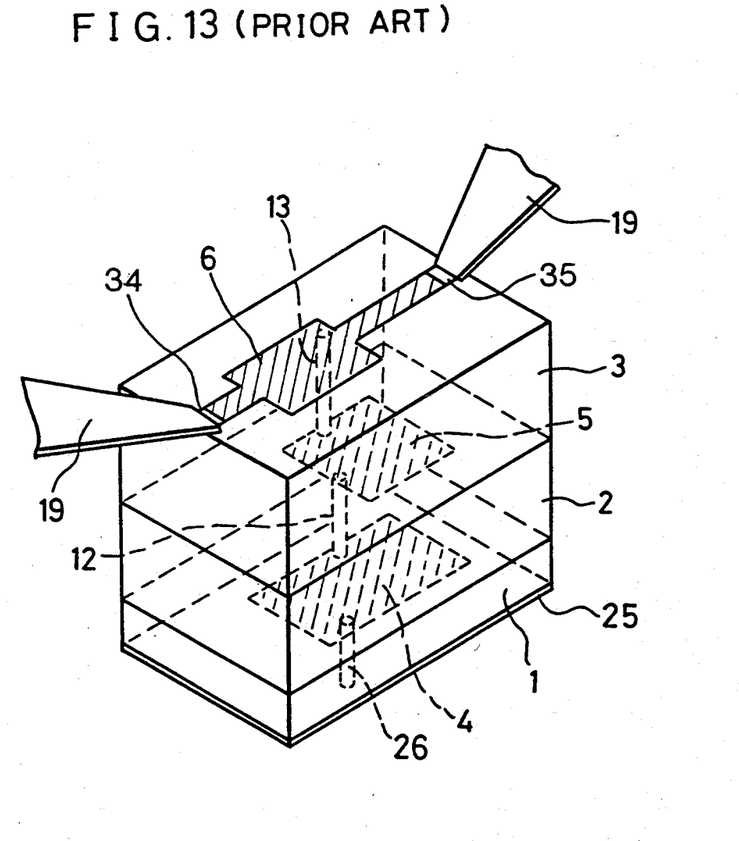
FIG. 13 is a perspective view illustrating measurement of the characteristics of circuits in the prior art module of FIG. 12.

In operation, each of the circuits 4, 5, and 6 responds to the signal applied to the input and output terminals 34 and 35 because of the interconnections provided by the via hole structures. The frequency response characteristics of the module can be determined by applying probes 19 to each of the input and output terminals 34 and 35 to supply test signals to and sense output signals from the circuits 4, 5, and 6 as shown in FIG. 13. Generally, the probes 19 are part of a transmission line, for example, a coplanar waveguide or a slot line.

Figure 14:
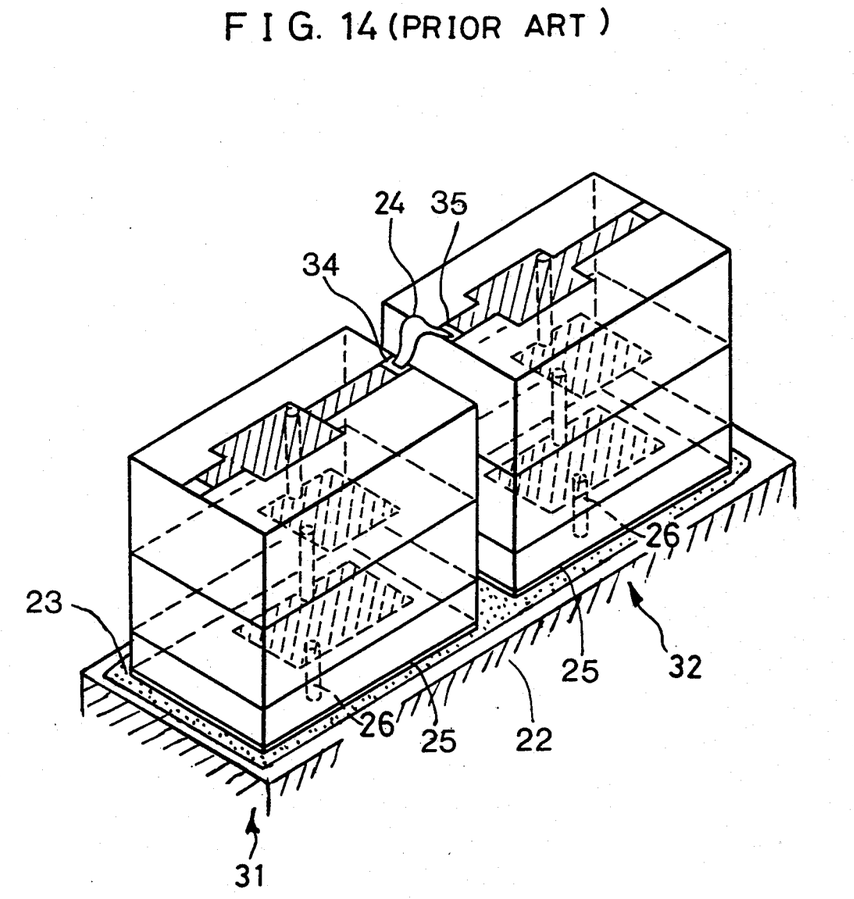
FIG. 14 is a perspective view illustrating two modules according to the prior art electrically connected together.

Two multiple layer semiconductor circuit modules 31 and 32, of the type shown in FIGS. 12 and 13, can be interconnected as illustrated in FIG. 14. As shown there, the multiple layer semiconductor circuit modules 31 and 32 are commonly mounted on an electrically conducting base 22 with a solder 23. The solder and base electrically interconnect the respective ground electrodes 25 of the MMICs 31 and 32. Adjacent input and output terminals 34 and 35 of the MMIC 31 and MMIC 32 are interconnected by a gold ribbon or gold wire 24. Additional modules can be interconnected in the same manner as shown in FIG. 14.

In the prior art multiple layer semiconductor circuit modules of FIGS. 12-14, certain problems have arisen. For example, the via hole structures include a metal having a coefficient of thermal expansion significantly different from the coefficient of thermal expansion of the first and second insulating layers 2 and 3 and the substrate 1. When the temperature of the module changes, stresses between the via hole structure and the insulating layers and substrate are produced because of the different amounts of expansion of the different materials. These stresses can, under severe circumstances, lead to cracking of the insulating layers.

When several of the modules are interconnected, they must be interconnected through the terminals 34 and 35 which employ the via hole structures to reach circuits 4 and 5. In other words, it is not possible to connect the respective first and second circuits of the two modules 31 and 32. In addition, when a gold wire or ribbon 24 is employed to interconnect two or more of the modules, it is difficult to maintain the particular characteristic impedance of the conductor structure on the exposed surface of the modules. When the modules are used at high frequencies, for example, in a microwave range, the failure to maintain a constant characteristic impedance results in a high voltage standing wave ratio (VSWR) i.e., signal losses, and other undesirable effects.

In the module shown in FIG. 12, a direct grounding connection is made between the grounding electrode 25 and the first circuit 4 by the via hole structure 26. However, the ground connection to the second and third circuits 5 and 6 must pass through via hole structures 12 and 13, respectively, from the grounding electrode 25. Because the via hole structures have a relatively small diameter, for example, several hundred microns at most, the grounding interconnection is relatively long in relation to its cross-sectional area. At microwave frequencies, such an interconnection has a relatively large parasitic inductive component that adversely affects the operation of the circuits, for example, reducing the gain of an amplifier, altering the frequency of an oscillator, changing the threshold of a switch, altering the phase delay of a phase shifter, and the like.

The interconnections between the input and output terminals 34 and 35 and the first and second circuits 4 and 5 prevent direct measurement of the individual characteristics of the first and second circuits 4 and 5. Since the third circuit 6 is directly connected to the input and output terminals 34 and 35, the third circuit 6 influences the measurement of the characteristics of the first and second circuits 4 and 5. Likewise, the second circuit 5 influences measurements of the characteristics of the first circuit 4.

SUMMARY OF THE INVENTION

The present invention solves the problems encountered in the prior art. It is an object of the invention to provide a multiple layer semiconductor circuit module in which circuits at different layers are interconnected without using via hole structures, thereby avoiding the potential for cracking due to the different coefficients of thermal expansion of different materials.

It is another object of the invention to provide a multiple layer semiconductor circuit module that can be readily interconnected with a like module without introducing an impedance mismatch.

It is a further object of the invention to provide a multiple layer semiconductor circuit module in which the characteristics of the circuits at different layers within the module can be individually measured.

Yet another object of the invention is to provide a multiple layer semiconductor circuit module in which each circuit in a different layer can be electrically interconnected to ground without introducing significant inductance, thereby avoiding impedance mismatches when the module is used at relatively high frequencies.

A multiple layer semiconductor module according to the invention comprises a semiconductor substrate including opposed first and second surfaces and side walls transverse to the first and second surfaces; a first circuit disposed on the first surface of the substrate including a plurality of conductors, at least one of the conductors extending on the first surface of the substrate to one of the side walls of the substrate; a first electrically insulating layer disposed on the first surface of the substrate, covering the first circuit, and including a second surface adjacent to the first surface of the substrate, an opposed first surface, and side walls generally continuous with the side walls of the substrate; a second circuit disposed on the first surface of the first electrically insulating layer including a plurality of conductors, at least one of the conductors extending on the first surface of the first insulating layer to one of the side walls of the first insulating layer; a second electrically insulating layer disposed on the first surface of the first electrically insulating layer, covering the second circuit, and including a second surface adjacent to the first surface of the first electrically insulating layer, an opposed first surface, and side walls generally continuous with the side walls of the first insulating layer; a third circuit disposed on the first surface of the second electrically insulating layer including a plurality of conductors, at least one of the conductors extending on the first surface of the second insulating layer to one of the side walls of the second insulating layer; and at least one electrical conductor disposed on at least one of the side walls of the substrate and the first and second electrically insulating layers electrically interconnecting the first, second, and third circuits.

Other objects and advantages of the present invention will become apparent from the detailed description that follows. The detailed description and specific embodiments are provided for illustration only, since various additions and modifications within the spirit and scope of the invention will become apparent from the detailed description.

DESCRIPTION OF THE PREFERRED EMBODIMENTS

Figure 1:
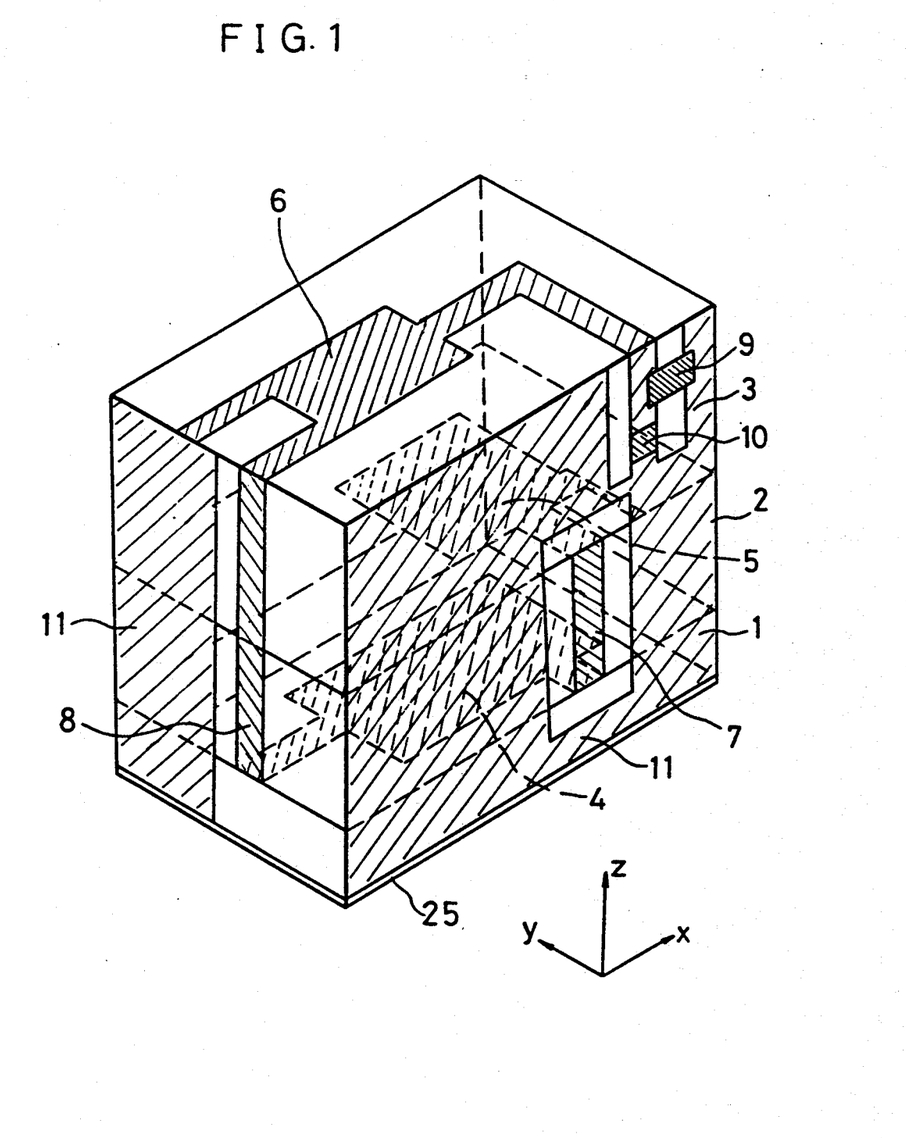
FIG. 1 is a perspective view of a multiple layer semiconductor circuit module in accordance with an embodiment of the invention.

FIG. 1 is a perspective view of a multiple layer semiconductor circuit module according to an embodiment of the invention. In FIG. 1 and in all other figures the same reference numbers refer to the same elements so that elements described once do not need to be and are not additionally described. In addition, in FIG. 1, orthogonal x, y, and z coordinates are shown to simplify reference to various side wall surfaces of the module which is shown as having a parallelepiped shape. However, modules according to the invention are not limited to those in the shape of a parallelepiped. In the module of FIG. 1, the substrate 1 includes not only front and rear surfaces but also side walls that are transverse to the front and rear surfaces. Those side walls are generally continuous with the side walls of the first and second insulating layers 2 and 3. The side walls are referred to according to their plane with reference to the coordinate system shown in FIG. 1.

In addition to the elements described with respect to the prior art module, the module of FIG. 1 includes electrically conducting films disposed on portions of various side wall surfaces of the module providing interconnections between the respective circuits in various layers of the module. For example, on the xz side wall surface, a signal conductor, i.e. metallization, 7 extending from the front surface of the substrate 1 to the interface between the first and second insulating layers 2 and 3 provides part of an electrical interconnection between the first circuit 4 and the second circuit 5. Additional portions of that interconnecting conductor are present on the front surface of the substrate 1 and on the first surface of the second insulating layer, i.e., at the interface between the first and second insulating layers 2 and 3. In addition, a grounding conductor, i.e., metallization, 11 in electrical contact with the grounding electrode 25 is disposed on portions of the xz side wall surface of the module, including on both sides of the signal conductor 7. The combination of the grounding conductor 11 and the signal conductor 7 form a coplanar waveguide structure on the xz side wall of the module. The xz side wall is also shown in FIG. 3.

Figure 2A:
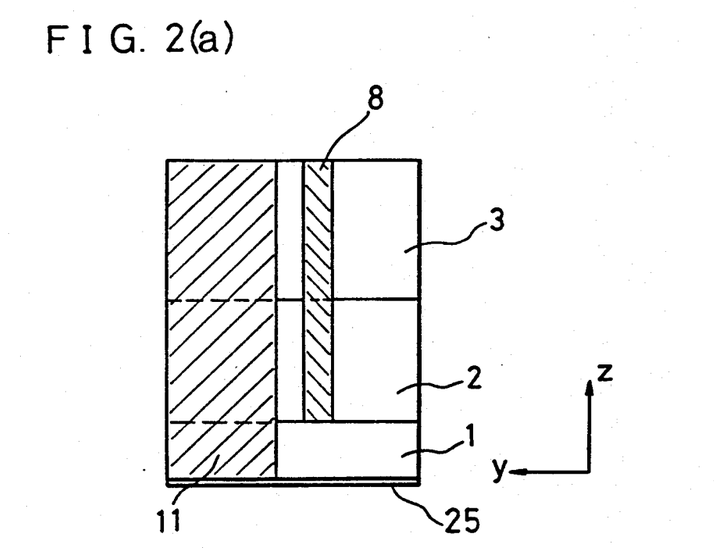
FIGS. 2(a) and 2(b) are side views showing alternative structures for embodiments of the invention.

An electrical interconnection between the first circuit 4 and the third circuit 6 is disposed on the yz side wall of the module. The yz side wall of FIG. 1 is also shown in FIG. 2(a). That interconnection includes a signal conductor 8 on the side wall and a grounding conductor 11 lying at one side of the signal conductor 8. The grounding conductor 11 is in electrical contact with the grounding electrode 25 of the module. This arrangement with a grounding conductor at only one side of the signal conductor forms a slot line structure. Alternatively, the slot line structure of FIG. 2(a) can be converted to a coplanar waveguide structure by including a second grounding conductor 11 on the opposite side of the signal conductor 8 as illustrated in FIG. 2(b).

Figure 3:
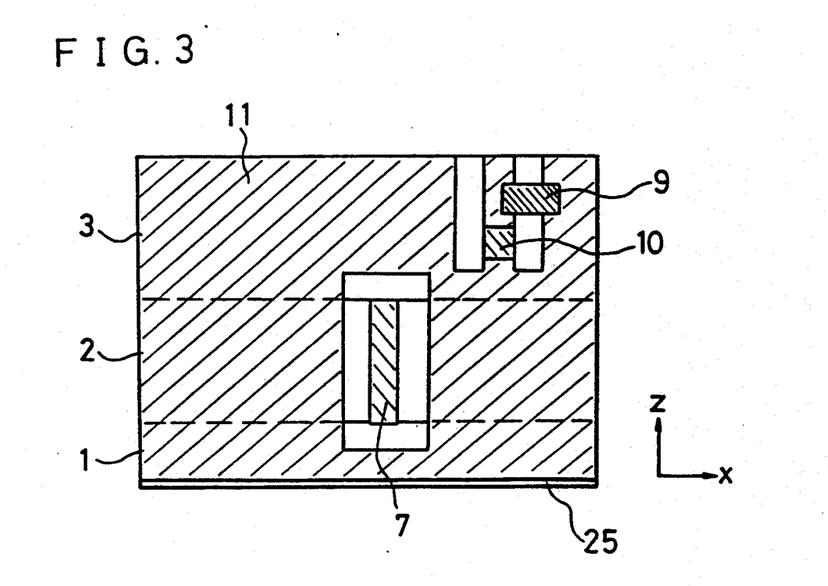
FIG. 3 is a side view of the embodiment of the invention shown in FIG. 1.

The side wall metallizations permit the mounting or formation on the modules of passive electrical components, as illustrated by the xz side wall view of FIGS. 1 and 3. There, separate from the conductor 7, the grounding conductor 11 on the side wall of the second insulating layer 3 includes several stripes. A capacitor 9, such as a metal-insulator-metal (MIM) capacitor, is connected between two legs of the grounding conductor. Likewise, a resistor 10, such as a metal thin film resistor, is connected in series with the grounding conductor. Other passive components, both different in type, such as a narrowed area to provide an inductance, or different in structure, such as an interdigitated capacitor, can be easily added to or formed in the side wall metallizations.

Figure 2B:
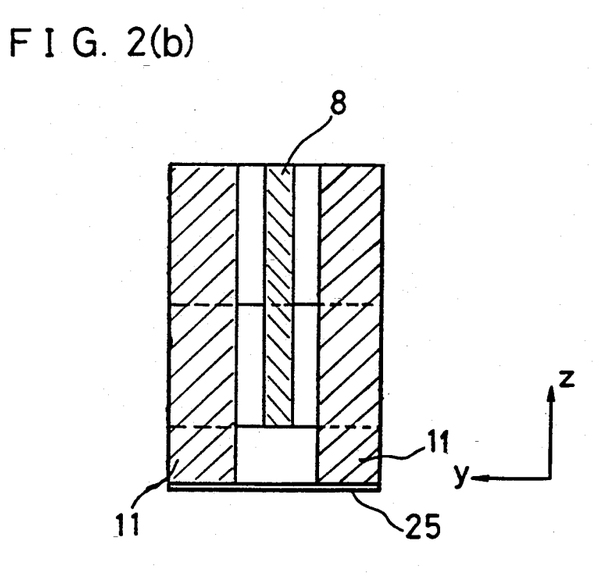

The side wall metallizations of the embodiment of the invention shown in FIGS. 1-3 does not employ via hole structures, thereby avoiding the cracking problem that can occur when one material is embedded within a different material. In addition, because the various metallizations on the side walls can be formed in arbitrary arrangements, a much wider variety of module designs can be prepared as compared to a module including via hole structures. Moreover, since the side wall metallizations can be formed in known microwave propagation structures, such as coplanar waveguides and slot lines, impedance mismatches and consequent signal losses can be avoided. Furthermore, since passive elements, such as the capacitor 9 and the resistor 10, can be added to the circuits 4, 5, and 6 by attaching the elements to side wall metallizations, increased circuit design flexibility is achieved in the invention.

The relatively large area and width of the grounding conductor 11 avoids the large inductive impedance component that is produced by the via hole structures in the prior art modules. Instead of a via hole structure diameter of several hundred microns at most, the grounding conductor can typically have a width of several thousand microns.

Figure 4:
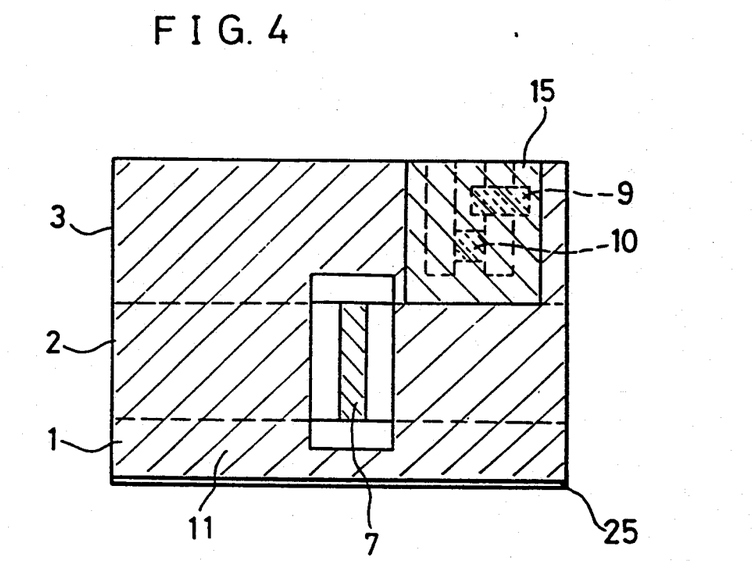
FIGS. 4 and 5 are side views of a multiple layer semiconductor circuit module in accordance with respective embodiments of the invention.
Figure 5:
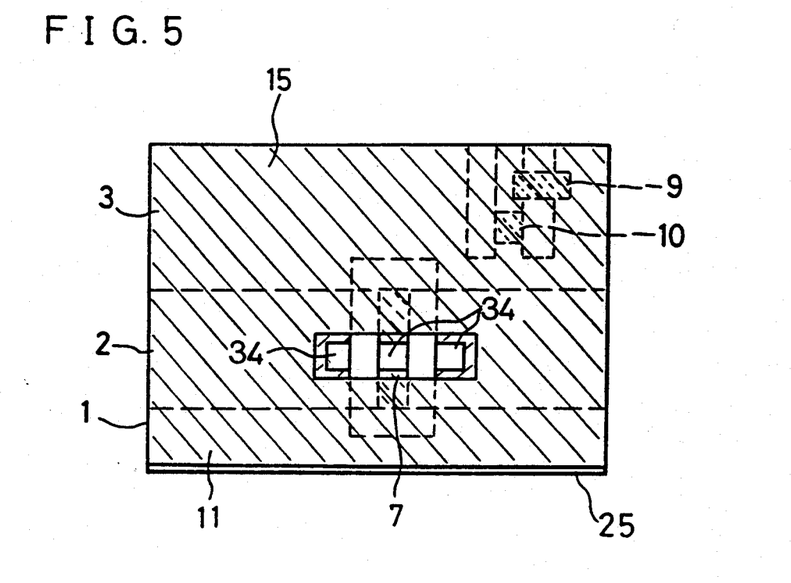

Further embodiments of the invention are illustrated in the side views of FIGS. 4 and 5 which correspond to the xz side wall, referring to the coordinate system of FIG. 1. In the embodiment of FIG. 4, an electrically insulating film 15 is disposed on a portion of the side wall covering the capacitor 9 and resistor 10. In FIG. 5, the entire side wall surface is covered by the insulating film 15 except for limited areas that provide access to portions of the metallizations 7 and 11 thereby forming terminals 34. Preferably, the insulating film 15 is formed of SiON which prevents moisture from entering the module, thereby improving reliability.

Figure 6:
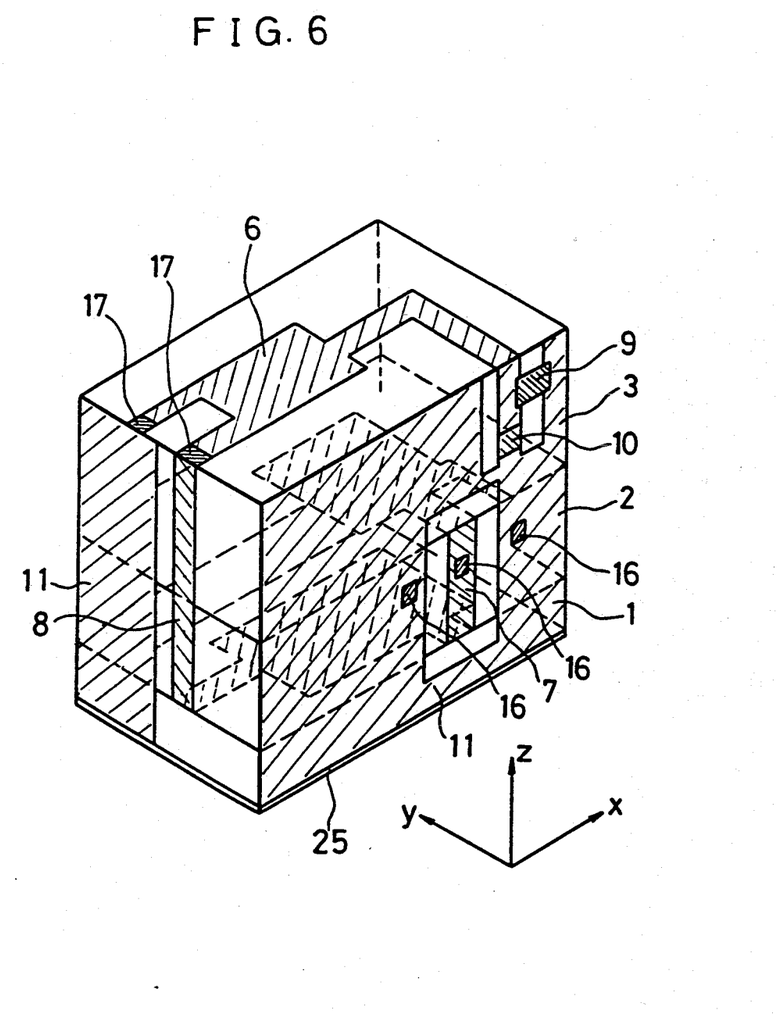
FIG. 6 is a perspective view of a multiple layer semiconductor circuit module in accordance with an embodiment of the invention.
Figure 7:
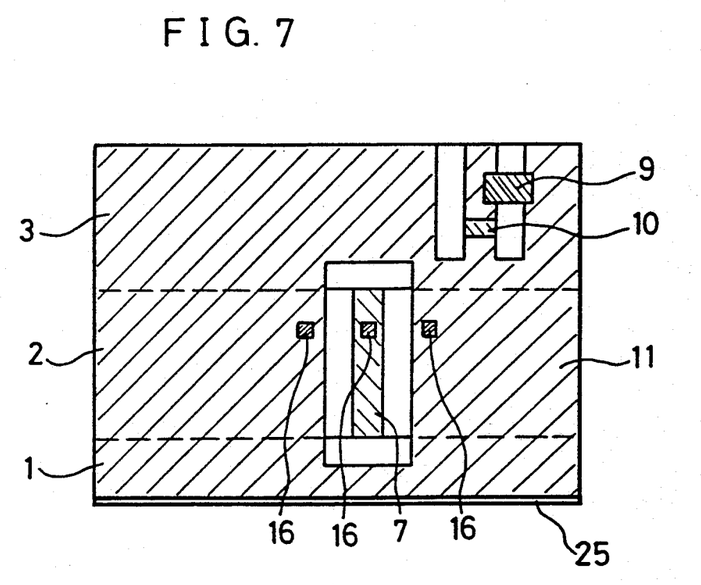
FIG. 7 is a side view of the embodiment of the invention shown in FIG. 6.

Still another embodiment of the invention is shown in a perspective view in FIG. 6. The xz side wall of the module of FIG. 6 is shown in FIG. 7. In addition to the elements already described, the module of FIG. 6 includes three projecting electrodes 16, two disposed on the grounding conductor 11 and one disposed on the signal conductor 7. Preferably, the projecting electrodes 16 are gold or another low resistance metal or an alloy, simplifying interconnection of the module with another module as described below in connection with FIGS. 11(a) and 11(b). The module of FIG. 6 also includes metal pads 17, for example gold, disposed on each of two portions of the metallization on the top surface of the module for improving the quality of an interconnection between the module and probes.

Figure 8:
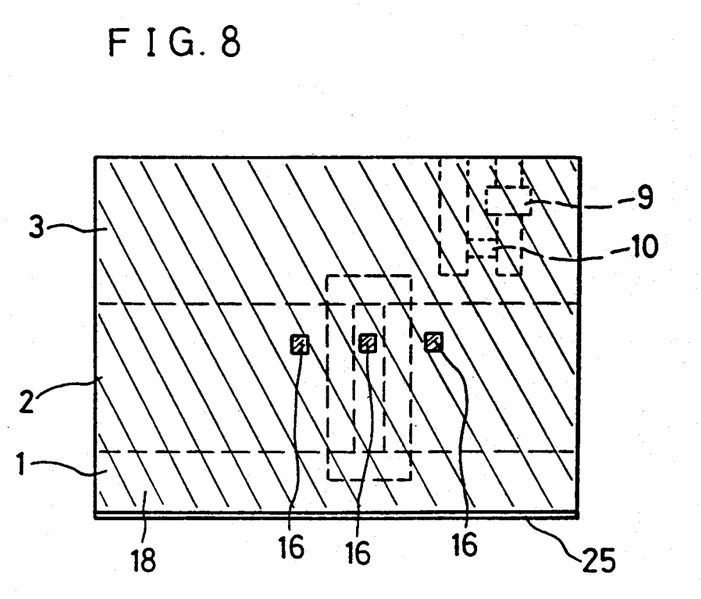
FIG. 8 is a side view of a multiple layer semiconductor circuit module in accordance with an embodiment of the invention.
Figure 11A:
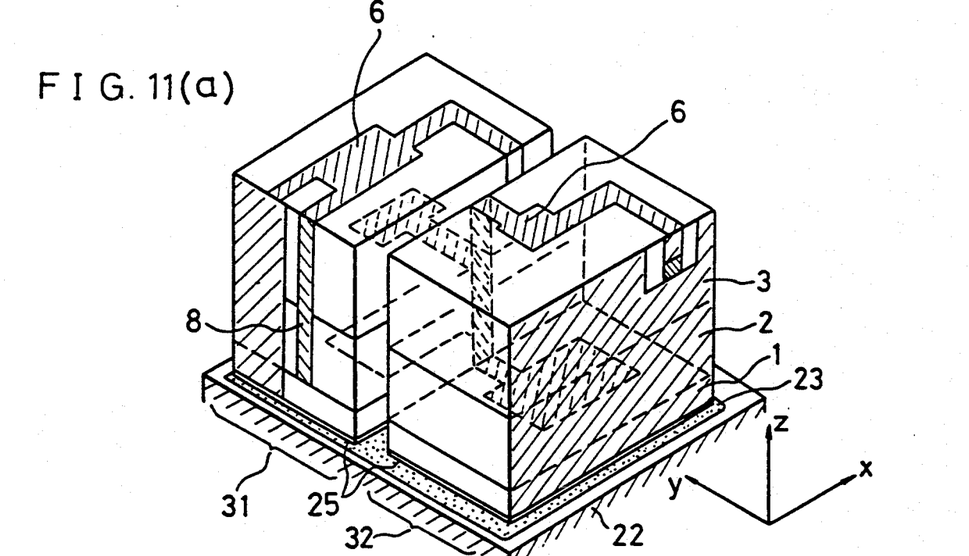
FIGS. 11(a) and 11(b) are perspective views illustrating two modules according to an embodiment of the invention electrically connected together.
Figure 11B:
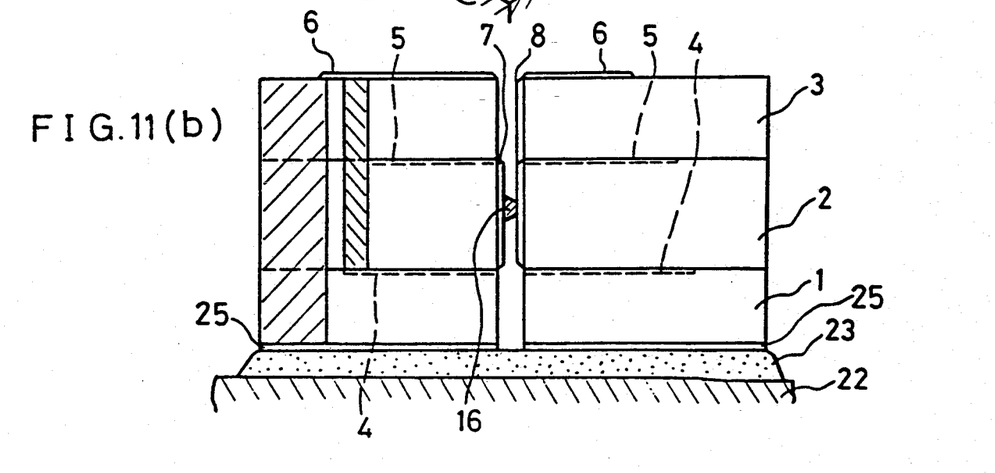

A step in manufacturing a module with the projecting electrodes 16 is illustrated in FIG. 8, a view of the xz side wall of the module. There, a photoresist film 18 is deposited on the side wall and patterned so that openings are prepared where the projecting electrodes 16 are to be formed. Thereafter, the metal, such as gold, forming the projecting electrodes 16 is deposited, for example, by electroless plating, in the openings in the photoresist film 18. The plating is continued for a sufficiently long period to produce projecting electrodes of the desired dimensions. Thereafter, the photoresist film 18 removed, leaving the projecting electrodes 16 in place as shown in FIGS. 7, 11(a), and 11(b).

Figure 9:
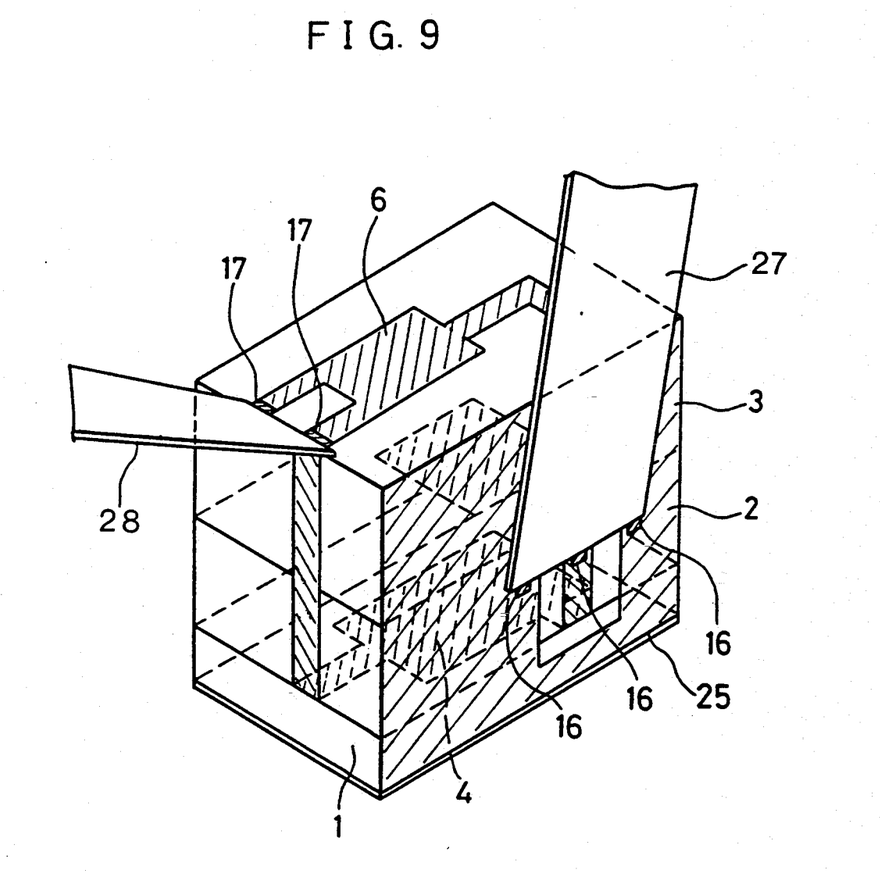
FIG. 9 is a perspective view illustrating measurement of the characteristics of the circuits in a module according to an embodiment of the invention.

The interconnection arrangement with electrodes and conductors disposed on the side walls of the module in accordance with the invention facilitates the measurement of the electrical characteristics of the respective circuits in the module. In other words, the electrical characteristics of the respective circuits can be individually measured by applying probes to respective electrodes. An example of this technique is illustrated in FIG. 9. A probe 27 including three conductors is applied to the xz side wall of the module with the three conductors in contact with respective projecting electrodes 16. An example of the probe 27 is shown in plan view in FIG. 10(a). The probe includes an insulating substrate 20 on which three mutually insulated electrically conducting films 21 are disposed. Those three electrically conducting films form a coplanar waveguide in which the central conductor is a signal conductor and the two outside films are ground conductors. The electrically conducting films 21 are geometrically arranged for registration with three projecting electrodes 16 on the side wall of the module.

Figure 10A:
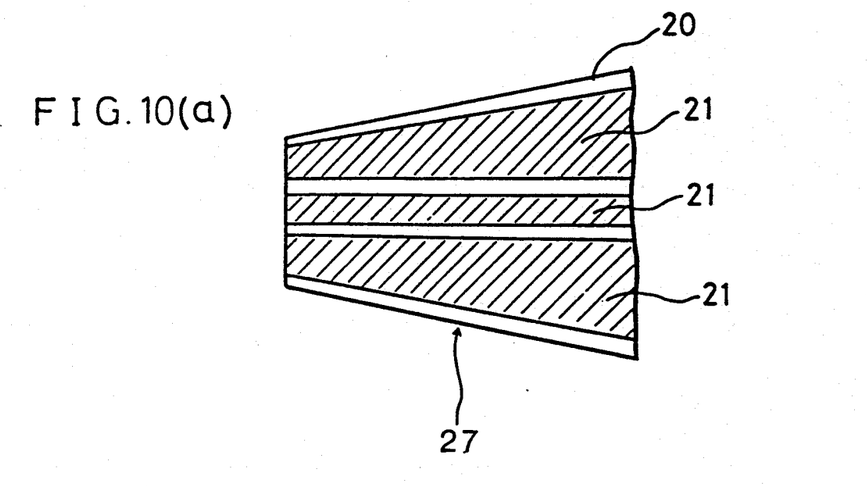
FIGS. 10(a) and 10(b) are plan views of alternative probes that may be employed in the measurement process illustrated in FIG. 9.
Figure 10B:
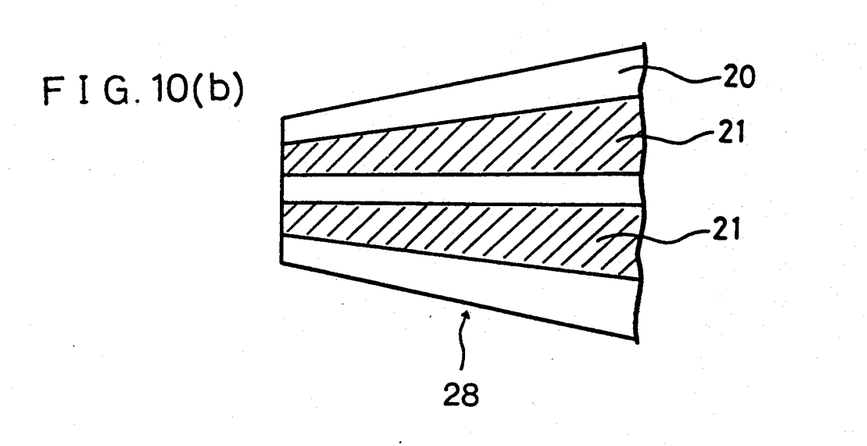

In FIG. 9, a probe 28 is in contact with the two plated pads 17 on the top surface of the module. The structure of the probe 28 is shown in FIG. 10(b). That probe includes an electrically insulating substrate 20, such as a ceramic or glass, on which two neutrally insulated electrically conducting films 21 are disposed. Those two films 21, one of which is in contact with the grounding conductor 11 in FIG. 9 and the other of which conducts a signal, form a slot line structure.

As is apparent from FIG. 9, particularly when considered in conjunction with FIG. 6, probe 27 can be used to measure the individual electrical characteristics of the second semiconductor circuit 5 or of the first semiconductor circuit 4. The characteristics of the third semiconductor circuit 6 are directly measured through the probe 28. The measurements made in the manner shown in FIG. 9 using the probes of FIGS. 10(a) and 10(b) are particularly adapted to high frequency operations, such as in microwave frequency ranges. When a module according to the invention operates at lower frequencies, other kinds of probes, such as simple wires, can be used to make measurements of characteristics of the individual circuits without introducing signal reflections or impedance mismatches that interfere with the precision of the measurement results.

Modules according to the invention can be easily interconnected with other similar modules without introducing impedance mismatches or producing significant signal losses as in the prior art. FIGS. 11(a) and 11(b) are, respectively, perspective and side views of two modules 31 and 32 according to the invention interconnected with each other. The grounding electrodes 25 of the two modules are commonly mounted on a base 22 that may be kovar, copper, or tungsten with an alloy or solder, such as a gold tin solder, 23. The projecting electrodes 16 of module 31 are in direct contact with respective electrodes on an xz side wall of the module 32 providing an electrical interconnection between the modules. The projecting electrodes 16 permit and require very close placement of the modules 31 and 32 so that little signal loss is produced and a low VSWR connection, when microwave signals are employed, with the interconnected modules is obtained. The distance between the modules 31 and 32 is repeatable since it is controlled by the dimensions of the electrode 16. Moreover, because of the short distance of the signal path between the modules 31 and 32, even when the electrodes 16 have a relatively small cross-sectional area, no significant parasitic inductance is produced by them.

Although the invention has been described in terms of a module including a substrate, two electrically insulating layers, and three circuits, the invention is not limited to a particular number of circuits or electrically insulating layers. Instead, the invention is particularly directed to a multiple layer arrangement of circuits, a substrate, and insulating layers forming a module with electrical interconnections between the circuits and other electrical components employing metallizations disposed on the side walls of the module.

What is claimed is:

1. A multiple layer semiconductor circuit module comprising:
    a semiconductor substrate including opposed first and second surfaces and side walls transverse to the first and second surfaces;
    a first circuit disposed on the first surface of the substrate including a plurality of conductors, at least one of the conductors extending on the first surface of the substrate to one of the side walls of the substrate;
    a first electrically insulating layer disposed on the first surface of the substrate, covering the first circuit, and including a second surface adjacent to the first surface of the substrate an opposed first surface, and side walls substantially continuous with the side walls of the substrate;
    a second circuit disposed on the first surface of the first electrically insulating layer including a plurality of conductors, at least one of the conductors extending on the first surface of the first insulating layer to one of the side walls of the first insulating layer;
    a second electrically insulating layer disposed on the first surface of the first electrically insulating layer, covering the second circuit, and including a second surface adjacent to the first surface of the first electrically insulating layer an opposed first surface, and side walls substantially continuous with the side walls of the insulating layer;
    a third circuit disposed on the first surface of the second electrically insulating layer including a plurality of conductors, at least one of the conductors extending on the first surface of the second insulating layer to one of the side walls of the second insulating layer; and
    at least one electrical conductor disposed on at least one of the side walls of the substrate and the first and second electrically insulating layers electrically interconnecting the first, second, and third circuits.

2. The module of claim 1 including a plurality of electrical conductors disposed on at least one of the side walls of the substrate and the first and second electrically insulating layers.

3. The module of claim 2 wherein the plurality of electrical conductors includes a signal conductor and a grounding conductor together forming a slot line.

4. The module of claim 2 including at least one signal conductor and two grounding conductors disposed on opposite sides of the signal conductor together forming a coplanar waveguide.

5. The module of claim 2 including a passive electrical component mounted on a side wall of one of the first and second electrically insulating layers and connected to at least two of the electrical conductors on the side wall.

6. The module of claim 5 wherein the passive electrical component is a capacitor.

7. The module of claim 5 wherein the passive electrical component is a resistor.

8. The module of claim 5 including an electrically insulating film disposed on the side wall covering the passive electrical component and at least part of the plurality of electrical conductors.

9. The module of claim 2 including an electrically insulating film disposed on the side wall covering at least part of the plurality of electrical conductors.

10. The module of claim 1 including at least one electrically conducting projecting electrode contacting an electrical conductor disposed on the side wall of at least one of the first and second electrically insulating layers and extending from the side wall for electrically interconnecting the module to another.

11. The module of claim 10 including an electrically insulating film disposed on the side wall of the first and second electrically insulating layers covering the electrical conductor and leaving at least one electrically conducting projection electrode exposed.

12. The module of claim 1 including a grounding electrode disposed on the second surface of the semiconductor substrate.

13. The module of claim 12 including a grounding conductor disposed on the side wall of the semiconductor substrate and on a side wall of at least one of the first and second electrically insulating layers electrically connected to the grounding electrode.

14. The module of claim 1 including at least one electrical conductor disposed on the first surface of the second electrically insulating layer.

15. The module of claim 14 wherein the electrical conductor on the first surface of the second electrically insulating layer is connected to an electrical conductor disposed on at least one of the side walls of the first and second electrically insulating layers.

16. The module of claim 14 including a plurality of electrical conductors disposed on the first surface of the second electrically insulating layer.

17. The module of claim 16 wherein the plurality of electrical conductors includes a signal conductor and at least one grounding conductor together forming a slot line.

18. The module of claim 16 including at least one signal conductor and two grounding conductors disposed on opposite sides of the signal conductor together forming a coplanar waveguide.

19. The module of claim 16 including a grounding electrode disposed on the second surface of the semiconductor substrate.

20. The module of claim 19 including a grounding conductor disposed on the side surface of the semiconductor substrate and on the side surface of at least one of the first and second electrically insulating layers electrically connected to the grounding electrode.

21. The module of claim 1 wherein the semiconductor substrate is chosen from the group consisting of silicon, gallium arsenide, and indium phosphide.

* * * * *

UNITED STATES PATENT AND TRADEMARK OFFICE
CERTIFICATE OF CORRECTION

PATENT NO. : 5,160,907
DATED      : November 3, 1992
INVENTOR(S) : Nakajima et al.

It is certified that error appears in the above-identified patent and that said Letters Patent is hereby corrected as shown below:

Claim 1, col. 8, line 17, after "substrate" insert --,--;

line 30, after "layer" insert --,--;

line 32, after "the" (second occurrence) insert --first--.

Signed and Sealed this

Fifth Day of October, 1993

Attest:

BRUCE LEHMAN

Attesting Officer

Commissioner of Patents and Trademarks